(12) United States Patent
Hirayanagi

(10) Patent No.: US 6,627,903 B1
(45) Date of Patent: Sep. 30, 2003

(54) METHODS AND DEVICES FOR CALIBRATING A CHARGED-PARTICLE-BEAM MICROLITHOGRAPHY APPARATUS, AND MICROELECTRONIC-DEVICE FABRICATION METHODS COMPRISING SAME

(75) Inventor: Noriyuki Hirayanagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 170 days.

(21) Appl. No.: 09/659,205

(22) Filed: Sep. 11, 2000

(51) Int. Cl.[7] .............................. G01N 1/00; A61N 5/00; G21G 5/00; H01J 37/244
(52) U.S. Cl. ................................. 250/491.1; 250/492.2; 250/397; 250/310
(58) Field of Search .................................. 250/397, 307, 250/310, 491.1, 492.2

(56) References Cited

U.S. PATENT DOCUMENTS

| | | | | |
|---|---|---|---|---|
| 4,322,626 A | * | 3/1982 | Kawashima | 250/492.2 |
| 4,807,159 A | * | 2/1989 | Komatsu et al. | 364/524 |
| 5,155,359 A | * | 10/1992 | Monahan | 250/307 |
| 5,301,124 A | * | 4/1994 | Chan et al. | 250/491.1 |
| 6,426,501 B1 | * | 7/2002 | Nakagawa | 250/310 |

OTHER PUBLICATIONS

Reimer, *Transmission Electron Microscopy: Physics of Image Formation and Microanalysis*, 392–421, Springer-Verlag, 1984.

* cited by examiner

*Primary Examiner*—Bruce Anderson
(74) *Attorney, Agent, or Firm*—Klarquist Sparkman LLP

(57) ABSTRACT

Methods are disclosed for performing a calibration of a charged-particle-beam (CPB) microlithography apparatus. In an embodiment, a specimen having a crystal-orientation plane is mounted on a specimen stage of the CPB microlithography apparatus. A charged particle beam (e.g., electron beam) produced by a suitable source passes through a CPB-optical system so as to irradiate the surface of the specimen. Using a deflector, the beam is scanned over an area of the specimen surface, and backscattered charged particles produced by the irradiated area of the specimen are detected. A corresponding electrical signal produced by detecting the backscattered particles is produced. The signal has a property that is a function of the specific crystalline properties of the specimen surface. From the signal, the relationship between the angle of incidence of the beam on the specimen surface versus the output of the deflector is determined and used to calibrate the beam axis of the CPB-optical system.

30 Claims, 3 Drawing Sheets

METHODS AND DEVICES FOR CALIBRATING A CHARGED-PARTICLE-BEAM MICROLITHOGRAPHY APPARATUS, AND MICROELECTRONIC-DEVICE FABRICATION METHODS COMPRISING SAME

FIELD OF THE INVENTION

This invention pertains to microlithography (projection-transfer of a pattern, defined on a reticle, to a suitable substrate). Microlithography is a key technology used in the manufacture of microelectronic devices such as integrated circuits, displays, and the like. More specifically, the invention pertains to microlithography performed using a charged particle beam such as an electron beam or ion beam. Even more specifically, the invention pertains to calibrations, as performed with a charged-particle-beam microlithography apparatus, directed to achieving accurate alignment of the reticle with the substrate.

BACKGROUND OF THE INVENTION

In charged-particle-beam (CPB) microlithography (i.e., microlithography performed using a charged particle beam such as an electron beam or ion beam), as in optical microlithography (i.e., microlithography performed using visible or ultraviolet light), obtaining accurate alignment between the reticle and the substrate is extremely important. Current microlithography apparatus include sophisticated devices for determining reticle-substrate alignment. In a CPB microlithography apparatus as currently available, these alignments involve impinging a charged particle beam on a mark on the substrate or substrate stage and detecting charged particles (e.g., electrons) backscattered from the mark.

In various techniques for determining reticle-substrate alignment using a charged particle beam, it is important to be able to determine and calibrate the angle of incidence of the beam on the substrate (specimen) surface. A conventional method for calibrating the angle of incidence of an electron beam on a specimen surface is shown in FIG. 3. In the figure, an electron beam EB propagating along an axis AX is deflected by a deflector 70 to impinge on a surface 100 of a specimen (e.g., semiconductor wafer). The surface 100 includes an alignment mark 101. When electrons of the beam EB impinge on the alignment mark 101, backscattered electrons are produced that propagate to and are detected by a backscattered-electron (BSE) detector 72 situated upstream of the surface 100. Typically, the deflector 70 deflects the beam EB in a scanning manner over the mark 101.

To perform the conventional calibration method, a calibration specimen (having a surface 100 bearing an alignment mark 101) is mounted on a specimen stage. The specimen stage is positioned such that the surface 100 is at a desired first axial position (first "height"). With the specimen positioned in this manner, the electron beam EB irradiates and is scanned across the specimen. The position of the alignment mark 101 is determined from a BSE signal waveform produced by the BSE detector 72, based on backscattered electrons propagating from the alignment mark 101.

After obtaining the BSE signal waveform from the alignment mark 101, the specimen table is moved axially (in the Z-direction) to place the surface 100 at a second "height" (the surface at the second height is denoted 100', and the alignment mark on the surface at the second height is denoted 101'). The difference between the first height and second height is denoted $\Delta Z$. With the specimen positioned at the second height, the electron beam EB irradiates and is scanned across the specimen. The position of the alignment mark 101' is determined in the same manner as described above with respect to the alignment mark 101.

Referring further to FIG. 3, a respective angle $\theta$ at which the electron beam EB is incident to the specimen surface 100, 100' is found by determining $\Delta X$ (difference in X-axis position of the alignment mark 101' relative to the X-axis position of the alignment mark 101) and $\Delta Z$ (change in elevation of the specimen stage). Normally, whenever the deflection angle of the electron beam relative to the axis AX is zero degrees, the angle of incidence $\theta$ of the electron beam on the specimen surface should be zero degrees. Consequently, an electron-optical system (through which the electron beam passes) or the specimen stage is adjusted such that the angle $\theta$ is zero degrees.

In the conventional method described above, the accuracy with which the angle $\theta$ is determined is a function of the magnitude of Z-direction movement ($\Delta Z$) of the specimen stage and the accuracy with which the alignment mark is detected. For example, if the Z-direction movement $\Delta Z$ is 10 $\mu$m and the alignment-mark detection accuracy is 0.1 $\mu$m, then the approximate accuracy ($\Delta\theta$) with which the angle $\theta$ can be detected is determined as follows:

$$\Delta\theta = \arctan(0.1\ \mu m/10\ \mu m) = 10\ mrad$$

(10 mrad is a common value for this accuracy). If the Z-direction movement ($\Delta Z$) is 100 $\mu$m and the alignment-mark detection accuracy is 10 nm, then the accuracy with which the angle $\theta$ should be detected is approximately 100 $\mu$rad. To obtain this accuracy, an angle-detection accuracy of approximately 10 $\mu$rad is required. Unfortunately, with a conventional electron-beam microlithography apparatus, such accuracy is difficult to achieve.

Generally speaking, it is difficult to improve the movement in the Z-direction and the alignment-mark detection accuracy more than the respective amounts discussed above. It also is difficult to obtain an alignment-mark detection accuracy of less than 100 $\mu$rad. In addition, whenever the height of the specimen stage is changed, accompanying lateral shifts also are encountered frequently. Hence, conventional methods for performing reticle-substrate alignment have factors that contribute significantly to degradations in detection accuracy.

SUMMARY OF THE INVENTION

In view of the shortcomings of the prior art as summarized above, an object of the present invention is to provide, inter alia, reticle-substrate calibration methods (as used with a charged-particle-beam (CPB) microlithography apparatus) that achieve high-accuracy calibration results using a simple procedure. Another object of the present invention is to provide microelectronic-device manufacturing methods by which high-accuracy patterns can be formed using a CPB microlithography apparatus calibrated according to the invention.

To such ends, and according to a first aspect of the invention, methods are provided (in the context of performing a CPB microlithography of a specimen using a CPB microlithography apparatus) for calibrating the CPB microlithography apparatus. In a representative embodiment of such a method, a specimen is provided presenting a surface having a crystalline structure. A charged particle beam (e.g., electron beam) is irradiated onto an area of the surface by scanning the beam in X- and Y-dimensions. While monitoring X- and Y-dimension beam-scanning coordinates of the scanned area, backscattered charged particles produced by the area being irradiated are detected. A corresponding backscattered-particle electrical signal is produced. The signal contains signal-amplitude data as a function of the X- and Y-dimension beam-scanning coordinates. The data in the signal are processed to produce a map pattern of signal amplitude as a function of X- and Y-dimension beam-scanning coordinates. Also produced are data regarding whether a center of the map pattern is aligned with an origin of X- and Y-dimension beam-scanning axes. If the center of the map pattern is not aligned with the origin of X- and Y-dimension beam-scanning axes, then an adjustment is performed to achieve such alignment so as to calibrate the apparatus.

In the foregoing method, the data-processing step can include calibrating an angle of incidence of the charged particle beam on the surface. Also, the step of providing a specimen can include providing a monocrystalline silicon specimen of which the presented surface has a 111 crystal-lattice structure.

In another representative embodiment, a specimen (presenting a surface having a given crystal-orientation plane) is mounted on a specimen table of the CPB microlithography apparatus. A charged particle beam (e.g., electron beam) is passed through a CPB-optical system so as to cause the beam to be incident on an area of the surface. A deflector is provided, and the deflector is supplied with an electrical signal serving to deflect the charged particle beam laterally as the beam passes through the CPB-optical system. This causes the charged particle beam incident on the area of the surface to move in a scanning manner over the area in X- and Y-dimensions. The X- and Y-dimension beam-scanning coordinates of the scanned area are monitored. Meanwhile, backscattered electrons (BSE) produced by the area being irradiated are detected to produce data concerning, for the detected backscattered electrons, BSE signal amplitude as a function of X- and Y-dimension beam-scanning coordinates. From the processed data, a relationship between BSE signal amplitude and the electrical signal provided to the deflector is determined. From this relationship, an angle of incidence of the charged particle beam on a specific locus in the area of the surface is determined. In this method, if the angle of incidence is not a pre-specified value, then an adjustment is performed to achieve the pre-specified value.

According to another aspect of the invention, CPB microlithography apparatus are provided. An embodiment of such an apparatus comprises a specimen stage and a CPB source. The specimen is mounted on the specimen stage, wherein the specimen desirably presents a surface having a crystal-lattice structure. A CPB source is situated and configured to produce a charged particle beam propagating downstream of the source. A CPB-optical system is situated and configured to irradiate the charged particle beam, from the CPB source, onto an area of the surface while scanning the beam relative to the specimen over the area. A backscattered-particle detector is situated and configured to detect backscattered charged particles propagating from the irradiated region of the specimen and to produce, from the detected particles, a corresponding backscattered-particle signal. The backscattered-particle signal exhibits a characteristic corresponding to a property of the crystal-lattice structure of the surface. The apparatus also includes a calibration controller connected to the backscattered-particle detector and configured to receive the backscattered-particle signal and to perform a calibration of the CPB microlithography apparatus based on a value of a parameter of the backscattered-particle signal. Desirably, the characteristic of the backscattered-particle signal is signal amplitude as a function of X- and Y-direction beam-scanning coordinates. The calibration controller desirably is configured to produce a map pattern of backscattered-particle signal amplitude as a function of X- and Y-dimension beam-scanning coordinates. The calibration controller can be configured to obtain data regarding whether a center of the map pattern is aligned with an origin of X- and Y-dimension beam-scanning axes.

As noted above, the specimen used at least for calibration desirably is made of a material having crystalline properties (e.g., monocrystalline silicon). A charged particle beam irradiates and scans an area of the specimen. The angle at which the beam is incident to the specimen surface is detected by processing a signal waveform of a characteristic BSE signal from the specimen surface. For example, backscattered charged particles from a crystalline surface produce a signal in which a change in amplitude of the signal is as function of the angle of incidence of the beam on the specimen surface and of the specific location (relative to the crystal lattice) being impinged by the beam. This phenomenon arises because of differences in how easily an incident charged particle beam can pass through the specimen as a result of the crystalline properties of the specimen.

Whenever the incidence angle of the charged particle beam on the specimen surface exhibits such changes, the position at which the backscattered charged particle (originating from the irradiated crystalline surface) is detected also moves according to characteristics of the crystalline surface. As a result, the beam axis through the CPB-optical system can be detected from a relationship between the detection position of the waveform and the angle of incidence of the beam.

Using methods according to the invention, it is possible to obtain a highly accurate detection of beam position compared to conventional methods. In addition, methods according to the invention eliminate the need to change the height of the specimen during calibration. Hence, factors related to transverse shifting of the specimen following changes in the height of the specimen can be eliminated.

The foregoing and additional features and advantages of the invention will be more readily apparent from the following detailed description, which proceeds with reference to the accompanying drawings.

The present invention can be applied to any type of CPB microlithography apparatus or method, including (but not limited to) block exposure, whole-reticle transfer, divided-reticle transfer, and direct drawing.

DETAILED DESCRIPTION

Figure 1:
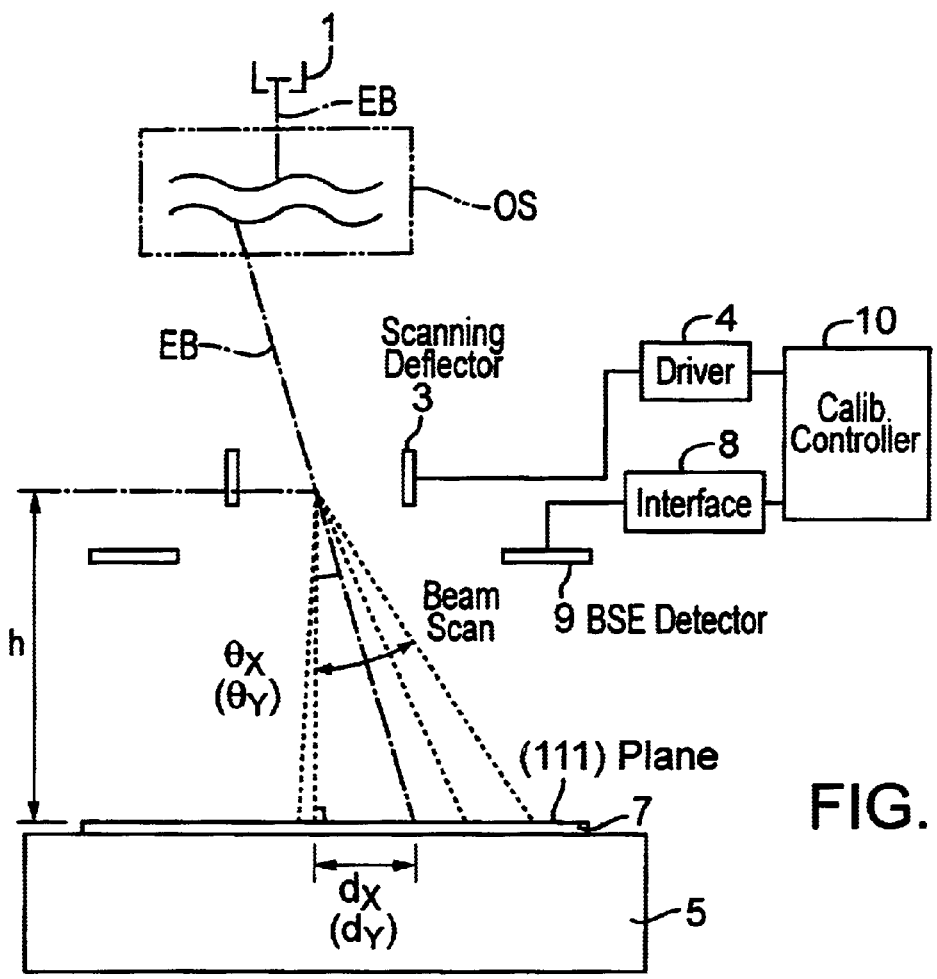
FIG. 1 is an elevational schematic diagram showing certain elements of an alignment device according to the invention.
Figure 3:
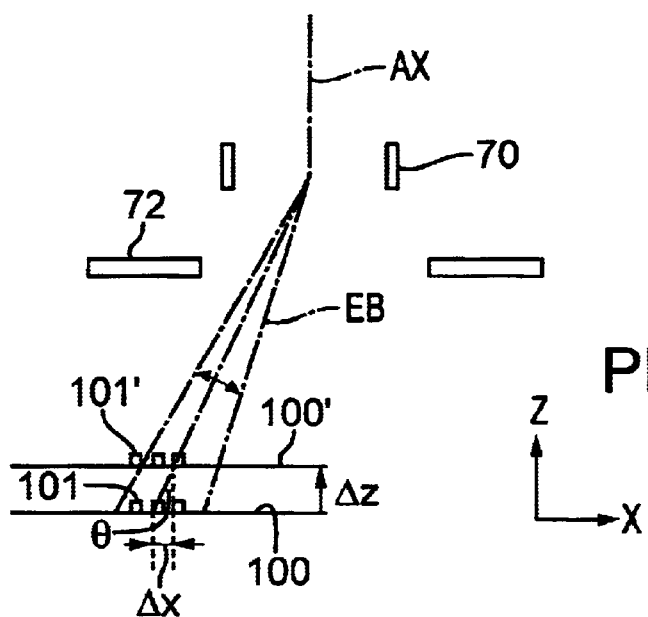
FIG. 3 is a schematic elevational diagram of certain elements of an alignment device, for calibrating the angle of incidence of a charged particle beam on the surface of a specimen (wafer).

A representative embodiment of an alignment device, according to the invention, as used with a charged-particle-beam (CPB) microlithography apparatus, is shown in FIG. 1. The FIG. 1 apparatus uses an electron beam as a representative charged particle beam; however, it will be understood that the same principles are applicable readily to use of an alternative charged particle beam (such as an ion beam).

The FIG. 1 apparatus comprises an electron-beam source 1 configured as an electron gun. The electron gun 1 produces an electron beam EB that propagates downstream of the electron gun 1. The electron beam EB passes through an electron-optical system OS to a specimen 7 (e.g., silicon wafer). The specimen 7 is mounted on a specimen stage 5. The specimen stage 5 is movable in each of the X-, Y-, and Z-directions, and is used to hold a specimen during CPB microlithography of the specimen 7.

The electron beam EB incident on the specimen 7 is deflected by a scanning deflector 3 situated downstream of the electron-optical system OS. The scanning deflector 3 is connected to a deflector driver 4. The driver 4 controllably energizes the scanning deflector 3 in a manner causing the electron beam EB to be scanned in two dimensions (the X-dimension and the Y-dimension) over an area of the specimen 7. The driver 4 is connected to a calibration controller 10 that routes appropriate control signals to the driver 4 for controlling operational parameters of the scanning deflector 3. Thus, the electron beam EB is deflected by the scanning deflector 3 to irradiate a desired area on the surface of the specimen 7, such as an area including an alignment mark.

In response to the electron beam EB irradiating the specimen 7 in this manner, backscattered electrons are produced from the irradiated surface of the specimen 7. The backscattered electrons are received and detected by a backscattered-electron (BSE) detector 9. Upon receiving the backscattered electrons, the BSE detector 9 produces a corresponding electrical BSE signal. The BSE signal is routed to the calibration controller 10 via an interface 8. The interface 8 includes an amplifier and an analog-to-digital (A/D) converter that convert the BSE signal into a form usable by the calibration controller 10. In this manner, the calibration controller 10 monitors changes in the amplitude of the BSE signal as the electron beam EB is scanned over the desired area on the specimen 7.

The calibration controller 10 also integrates the BSE signal with the signal provided meanwhile to the driver 4 (the signal provided to the driver 4 has encoded therein data concerning a respective angle by which the electron beam EB is to be deflected by the scanning deflector 3). The calibration controller 10 processes the integrated data and produces from the processed data an "image." The "image" can be in the form of a map of BSE signal amplitude as a function of location (in the X-Y deflection plane) within the area on the specimen scanned by the electron beam EB. Such a map also is termed an electron channeling pattern.

If the specimen is made of a material having crystalline properties (e.g., monocrystalline silicon) and presenting a particular crystal-lattice face to the electron beam, the resulting map can reveal substantial information (such as "Kikuchi bands") useful for calibrating the position of the specimen. For example, the map can reveal the location of a point, within the irradiated area of the substrate, at which the electron beam has a zero angle of incidence on the specimen surface. The map also can reveal whether this "zero-angle" point is aligned with the optical axis of the CPB-optical system (i.e., whether the "zero-angle" point is aligned with the point at which the beam-deflection X-axis crosses the beam-deflection Y-axis).

Figure 2A:
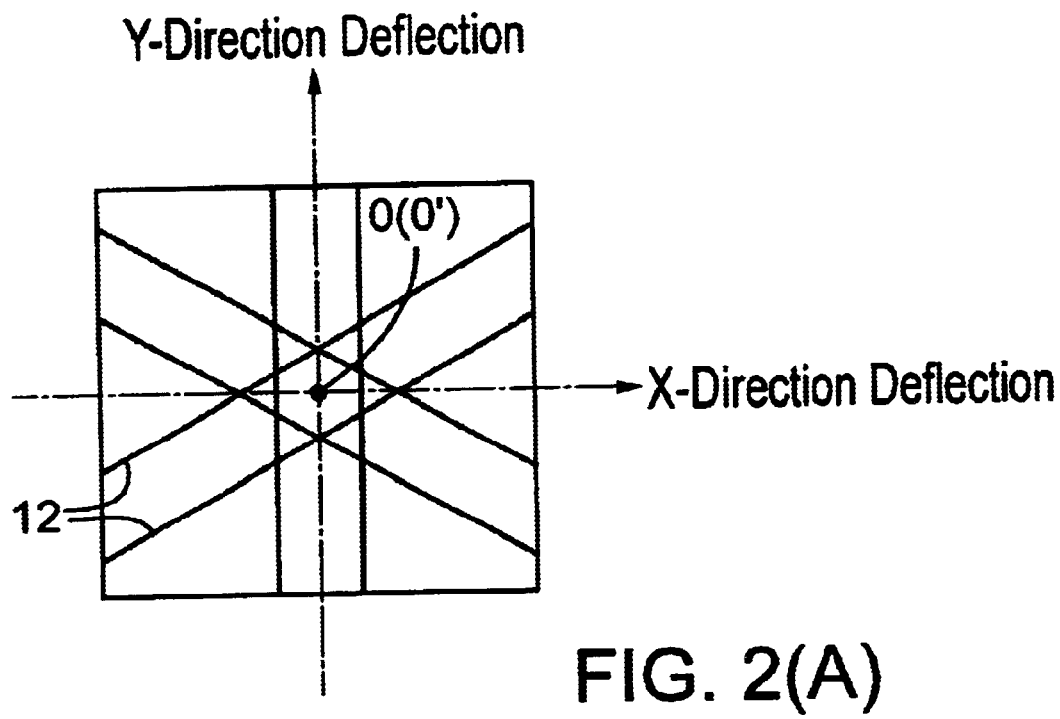
FIGS. 2(A)–2(B) are respective maps (electron channeling patterns) formed from the output of the scanning deflector 3 shown in FIG. 1. Each map shows characteristic "Kikuchi bands" for 111 silicon. The maps are plotted as amplitude of respective backscattered-electron (BSE) signals produced by the BSE detector 9 versus X- and Y-dimension beam deflection.
Figure 2B:
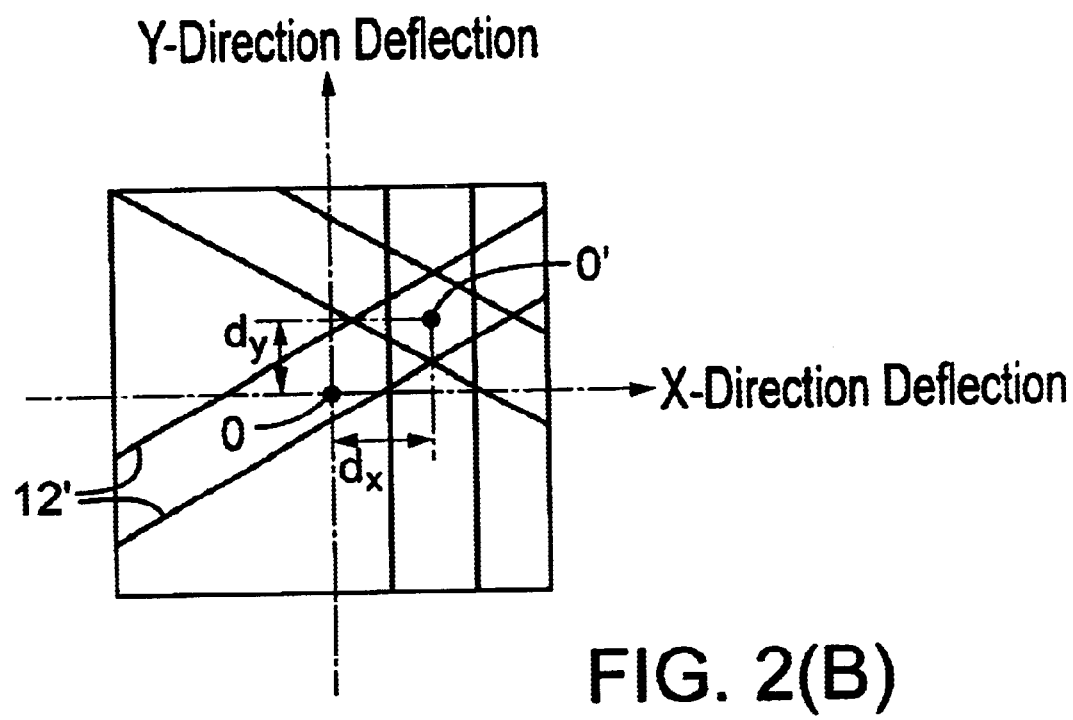

Exemplary maps are shown in FIGS. 2(A)–2(B) for a specimen that is a monocrystalline silicon wafer presenting an upstream-facing surface having a 111 crystal plane orientation. As noted above, as the electron beam is deflected by the deflector 3 to irradiate an area on the substrate in a scanning manner, the angle of incidence of the beam on the surface of the substrate changes with the deflection angle of the beam relative to the Z-axis (optical axis). The magnitude of this change is very small. There is an XY coordinate on the irradiated area at which the beam has zero angle of incidence. As the beam is swept over the irradiated area of the specimen, backscattered electrons are produced. The backscattered electrons are detected by the BSE detector 9, which produces a corresponding BSE signal, wherein the instantaneous amplitude of the BSE signal is a function of the corresponding XY coordinate being irradiated by the beam at the respective instant. Whenever the surface of the specimen has an ordered structure, such as a crystalline structure, the instantaneous BSE signal exhibits an amplitude in certain regions of the irradiated area that is measurably different than in other regions of the irradiated area. For example, the instantaneous BSE signal can have reduced amplitude in certain regions ("Kikuchi bands") of the irradiated area compared to other regions. If the specimen is a monocrystalline material, the locations of these various regions within an irradiated area of the specimen are consistent from one area to another on the surface of the specimen.

In FIGS. 2(A)–2(B), the abscissa (horizontal axis) is magnitude of deflection in the X-direction, and the ordinate (vertical axis) is the magnitude of deflection in the Y-direction. The heavy lines 12, 12', respectively, represent respective loci (Kikuchi bands) of specific XY deflection coordinates (on a 111 monocrystalline silicon specimen) in which the BSE signal amplitude is significantly lower than in other regions of the irradiated area of the specimen surface. The Kikuchi bands correspond with characteristics of the 111 crystal lattice being presented by the irradiated surface, i.e., with differences in the ease with which an impinging charged particle can pass through various loci on the crystal-lattice surface of the specimen. As can be seen, the six straight Kikuchi bands 12, 12' in each of FIGS. 2(A)–2(B) intersect in a specific pattern that allows the center of the pattern to be ascertained very accurately. The maps are configured using data calculated by the calibration controller 10.

Comparing FIG. 2(A) and FIG. 2(B), it can be seen that the pattern shown in FIG. 2(B) is displaced laterally relative to the pattern shown in FIG. 2(A). Namely, in FIG. 2(A), the center O' of the pattern is coincident with the origin O of the X- and Y-direction beam-scan axes. In FIG. 2(B), in contrast, the center O' of the pattern is shifted laterally from the origin O of the X- and Y-direction beam-scan axes. The origin O of the X- and Y-direction scan coordinates is a position at which the angle of deflection of the electron beam relative to the Z-axis is zero. This origin O also represents a point relative to which the electron beam has a zero deflection angle. Any point, other than the origin O, on the specimen is contacted by the electron beam as the electron beam is deflected laterally by the scanning deflector 3 relative to the Z-axis.

The origins O' of the patterns in FIGS. 2(A) and 2(B), respectively, are respective points on the specimen surface at which the electron beam is vertically incident. In FIG. 2(A), because the center O' of the pattern is coincident with the origin O of the X- and Y-direction beam-scan axes, an electron beam EB propagating from the electron-optical system OS but not deflected by the deflector 3 is vertically incident on the specimen surface at the origin O. Such a situation is desired, and represents a properly "calibrated" condition. In FIG. 2(B), wherein the center O' of the pattern is not coincident with the origin O of the X- and Y-direction beam-scan axes, the electron-optical system OS and the specimen stage 5 can be adjusted as required to achieve proper calibration.

When adjusting the beam axis of the electron-optical system OS, the accuracy of such an adjustment is taken into consideration in a method according to this invention.

In FIG. 2(B), the distance between the center O' of the pattern and the center O of the X- and Y-coordinates is a function of $d_X$ and $d_Y$, respectively. As shown in FIG. 1, the axial distance between the center of the scanning deflector 3 and the surface of the specimen 7 is denoted "h" (determined largely from design data for the apparatus). The electron beam EB emitted from the electron-optical system OS has an inclination angle of $\theta_X$ and $\theta_Y$, respectively, whenever the electron beam is propagating in a perfectly straight-line trajectory from the electron-optical system OS to the specimen 7 without being deflected by the scanning deflector 3. Useful mathematical relationships of these variables with each other are as follows:

$$\tan \theta_X = d_X/h$$

$$\tan \theta_Y = d_Y/h$$

Consequently, the incident angles $\theta_X$ and $\theta_Y$ of the electron beam on the specimen surface whenever the electron beam is not being deflected by the deflector 3 can be measured by measuring the respective distances $d_X$, $d_Y$.

For example, if h=10 mm and the detection accuracy of the distance d is 1 $\mu$m, then the detection accuracy of the angle $\theta$ will be approximately 10 $\mu$rad, and the desired accuracy will be obtained.

In actual practice, the foregoing method is very effective because it allows an adjustment to be made by an appropriate adjustment of the electron-optical system and of the inclination of the specimen stage while observing a displayed map of BSE signal amplitude and magnitude of deflection (such as that shown in FIG. 2(A)).

Figure 4:
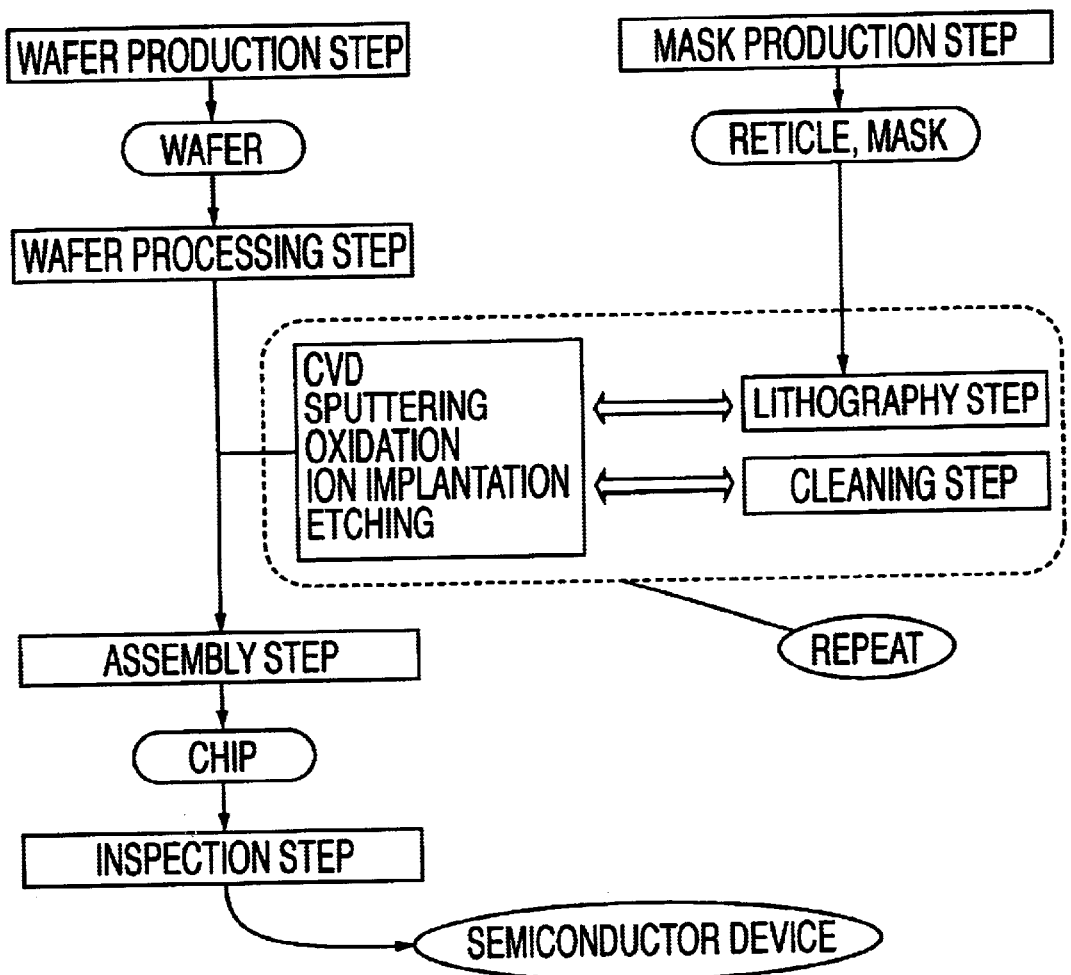
FIG. 4 is a process flowchart for manufacturing a microelectronic device, wherein the process includes a microlithography method according to the invention.

FIG. 4 is a flowchart of an exemplary method for fabricating microelectronic devices (e.g., computer chips or memory chips) to which apparatus and methods according to the invention readily can be applied. The fabrication method generally comprises the main steps of wafer production (wafer preparation), reticle production (reticle processing), wafer processing, device ("chip") dicing and assembly, and device inspection. Each step usually comprises several sub-steps.

Among the main steps, wafer processing is key to achieving the smallest feature sizes (critical dimensions), best inter-layer registration, and best device performance. In the wafer-processing step, multiple circuit patterns are layered successively atop one another in each die on the wafer, wherein the formation of each layer typically involves multiple sub-steps. Usually, many operative microelectronic devices are produced on each wafer.

Typical wafer-processing steps include: (1) thin-film formation (e.g., CVD or sputtering) involving formation of a dielectric layer for electrical insulation or a metal layer for forming electrodes or connecting wires; (2) oxidation of the substrate or of the thin film; (3) microlithography of the reticle pattern to the substrate, to form a resist pattern for selective processing of the thin film or of the substrate itself; (4) etching (e.g., anisotropic dry etching) or analogous step to etch the thin film or substrate according to the resist pattern; (5) implantation or diffusion of impurity or dopant as required to implant ions or impurities into the thin film or substrate according to the resist pattern; (6) resist stripping to remove residual resist from the wafer; and (7) chip inspection. Wafer processing is repeated as required (typically many times) to fabricate the desired semiconductor chips on the wafer.

Figure 5:
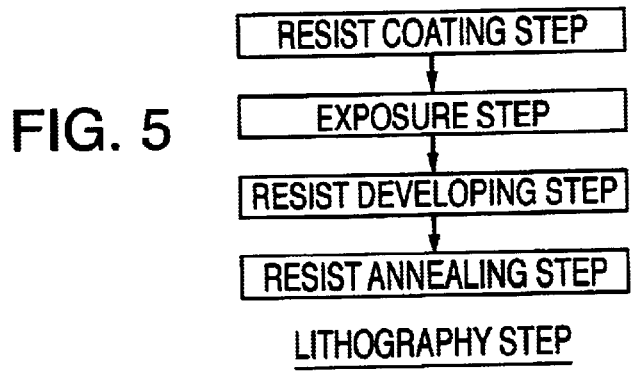
FIG. 5 is a process flowchart for performing a microlithography method as used in the FIG. 4 method.

FIG. 5 provides a flowchart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step); (2) exposure step, to expose the resist with the desired pattern; (3) development step, to develop the exposed resist; and (4) optional annealing step, to enhance the durability of the resist pattern.

Methods and apparatus according to the invention can be applied to a microelectronic-device fabrication process, as summarized above, to provide substantially improved accuracy of pattern transfer and resolution.

Whereas the invention has been described in connection with a representative embodiment, it will be understood that the invention is not limited to that embodiment. On the contrary, the invention is intended to encompass all modifications, alternatives, and equivalents as may be encompassed within the spirit and scope of the invention, as defined by the appended claims.

What is claimed is:

1. In a method for performing charged-particle-beam (CPB) microlithography of a specimen using a CPB microlithography apparatus, a method for calibrating the CPB microlithography apparatus, comprising:
    (a) providing a specimen presenting a surface and having a crystalline structure;
    (b) irradiating a charged particle beam onto an area of the surface by scanning the beam in X- and Y-dimensions;
    (c) while monitoring X- and Y-dimension beam-scanning coordinates of the scanned area, detecting backscattered charged particles produced by the area being irradiated, and producing a corresponding backscattered-particle electrical signal, the signal containing signal-amplitude data as a function of the X- and Y-dimension beam-scanning coordinates;
    (d) processing the data obtained in step (c) to produce a map pattern of signal amplitude as a function of X- and Y-dimension beam-scanning coordinates, and to obtain data regarding whether a center of the map pattern is aligned with an origin of X- and Y-dimension beam-scanning axes; and
    (e) if the center of the map pattern is not aligned with the origin of X- and Y-dimension beam-scanning axes, performing an adjustment to achieve such alignment so as to calibrate the apparatus.

2. The method of claim 1, wherein step (d) comprises calibrating an angle of incidence of the charged particle beam on the surface.

3. The method of claim 1, wherein step (a) comprises providing a monocrystalline silicon specimen having a 111 crystal-lattice structure.

4. The method of claim 1, wherein, in step (c), the produced backscattered-particle electrical signal includes data concerning a CPB-channeling pattern produced by backscattering of charged particles from the specimen.

5. The method of claim 4, wherein, in step (d), the CPB-channeling pattern is processed to reveal a pattern of Kikuchi bands for the specimen.

6. The method of claim 5, wherein the pattern of Kikuchi bands reveals a center point corresponding to a point, on the surface of the specimen, at which the charged particle beam is vertically incident.

7. The method of claim 6, wherein, in step (d), the center of the map pattern corresponds to the center point of the pattern of Kikuchi bands.

8. In a method for performing charged-particle-beam (CPB) microlithography of a specimen using a CPB microlithography apparatus, a method for calibrating the CPB microlithography apparatus, comprising:
(a) mounting a specimen, presenting a surface and having a given crystal-orientation plane, onto a specimen table of the CPB microlithography apparatus;
(b) passing a charged particle beam through a CPB-optical system so as to cause the beam to be incident on an area of the surface;
(c) providing a deflector and supplying the deflector with an electrical signal serving to deflect the charged particle beam laterally as the beam passes through the CPB-optical system, so as to cause the charged particle beam incident on the area of the surface to move in a scanning manner over the area in X- and Y-dimensions;
(d) monitoring X- and Y-dimension beam-scanning coordinates of the scanned area;
(e) while performing steps (c) and (d), detecting backscattered electrons (BSE) produced by the area being irradiated, and producing data concerning, for the detected backscattered electrons, BSE signal amplitude as a function of X- and Y-dimension beam-scanning coordinates;
(f) from the data obtained in step (e), determining a relationship between BSE signal amplitude and the electrical signal provided to the deflector; and
(g) from the relationship determined in step (f), determining an angle of incidence of the charged particle beam on a specific locus in the area of the surface.

9. The method of claim 8, wherein the charged particle beam is an electron beam.

10. The method of claim 8, further comprising a step in which, if the angle of incidence is not a pre-specified value, then performing an adjustment to achieve the pre-specified value.

11. The method of claim 8, wherein, in step (e), the data concerning BSE-signal amplitude includes data concerning a CPB-channeling pattern produced by backscattering of charged particles from the specimen.

12. The method of claim 11, wherein the CPB-channeling pattern is a pattern of Kikuchi bands revealing a center point corresponding to a point, on the surface of the specimen, at which the charged particle beam is vertically incident.

13. The method of claim 12, wherein, in step (f), the relationship is determined by integrating the signal provided to the deflector with the pattern of Kikuchi bands.

14. A charged-particle-beam (CPB) microlithography apparatus, comprising:

a specimen stage on which a specimen is mounted, the specimen presenting surface and having a crystal-lattice structure;

a CPB source situated and configured to produce a charged particle beam propagating downstream of the source;

a CPB-optical system situated and configured to irradiate the charged particle beam, from the CPB source, onto an area of the surface while scanning the beam relative to the specimen over the area;

a backscattered-particle detector situated and configured to detect back-scattered charged particles propagating from the irradiated region of the specimen and to produce, from the detected particles, a corresponding backscattered-particle signal, the backscattered-particle signal exhibiting a CPB-channeling pattern produced by interaction of the charged particle beam with the crystal-lattice structure of the specimen; and a calibration controller connected to the backscattered-particle detector and to the CPB-optical system, the controller being configured to receive the backscattered-particle signal and to perform a calibration of the CPB microlithography apparatus based on a value of a parameter of the backscattered-particle signal.

15. The apparatus of claim 14, wherein the characteristic of the backscattered-particle signal is signal amplitude as a function of X- and Y-direction beam-scanning coordinates.

16. The apparatus of claim 15, wherein the calibration controller is configured to produce a map pattern of backscattered-particle signal amplitude as a function of X- and Y-dimension beam-scanning coordinates.

17. The apparatus of claim 16, wherein the calibration controller is further configured to obtain data regarding whether a center of the map pattern is aligned with an origin of X- and Y-dimension beam-scanning axes.

18. The apparatus of claim 17, wherein the map pattern includes a pattern of Kikuchi bands corresponding to the CPB-channeling pattern, the pattern of Kikuchi bands revealing a center point corresponding to a point, on the surface of the specimen, at which the charged particle beam is vertically incident.

19. The apparatus of claim 18, wherein the controller is further configured to determine an offset of the center point of the pattern of Kikuchi bands relative to an origin of orthogonal scan coordinates of the charged particle beam over the area of the specimen surface.

20. The apparatus of claim 14, wherein:
the CPB-channeling pattern has a center;
the CPB-optical system is configured to scan the beam along orthogonal scan axes over the area of the specimen surface; and
the controller is further configured to determine an offset of an origin of the orthogonal scan axes relative to the center of the CPB-channeling pattern.

21. The apparatus of claim 20, wherein the value of the parameter corresponds to the offset.

22. The apparatus of claim 14, wherein the calibration performed by the controller is of an incidence angle of the charged particle beam on the specimen.

23. A method for performing charged-particle-beam (CPB) microlithography of a specimen, comprising:
mounting the specimen on a specimen stage of a microlithography apparatus;
performing a calibration of the CPB microlithography apparatus using a method as recited in claim 1; and microlithographically exposing a pattern onto the specimen.

24. A microelectronic-device fabrication process, comprising the steps:
(a) preparing a wafer specimen;
(b) processing the wafer specimen; and
(c) assembling devices formed on the wafer specimen during steps (a) and (b), wherein step (b) comprises a method for performing CPB microlithography as recited in claim 23.

25. A method for performing charged-particle-beam (CPB) microlithography of a specimen, comprising:
mounting the specimen on a specimen stage of a microlithography apparatus;
performing a calibration of the CPB microlithography apparatus using a method as recited in claim 8; and
microlithographically exposing a pattern onto the specimen.

26. A microelectronic-device fabrication process, comprising the steps:
(a) preparing a wafer specimen;
(b) processing the wafer specimen; and
(c) assembling devices formed on the wafer specimen during steps (a) and (b), wherein step (b) comprises a method for performing CPB microlithography as recited in claim 25.

27. A microelectronic-device fabrication process, comprising the steps:
(a) preparing a wafer specimen;
(b) processing the wafer specimen; and
(c) assembling devices formed on the wafer specimen during steps (a) and (b), wherein step (b) comprises the steps of (i) applying a resist to the wafer specimen; (ii) microlithographically exposing the resist; and (iii) developing the resist; and step (ii) comprises providing a charged-particle-beam microlithography apparatus as recited in claim 14; and using the charged-particle-beam microlithography apparatus to expose the resist with the pattern defined on the reticle.

28. A microelectronic device, produced by a method as recited in claim 24.

29. A microelectronic device, produced by a method as recited in claim 26.

30. A microelectronic device produced by a method as recited in claim 27.

* * * * *

UNITED STATES PATENT AND TRADEMARK OFFICE
CERTIFICATE OF CORRECTION

PATENT NO. : 6,627,903 B1
DATED : September 30, 2003
INVENTOR(S) : Hirayanagi

It is certified that error appears in the above-identified patent and that said Letters Patent is hereby corrected as shown below:

<u>Column 4,</u>
Line 21, "is as function" should read -- is a function --.

Signed and Sealed this

Sixteenth Day of November, 2004

JON W. DUDAS
*Director of the United States Patent and Trademark Office*